United States Patent
Musiol

(10) Patent No.: US 10,080,311 B1
(45) Date of Patent: Sep. 18, 2018

(54) MODULAR ENCLOSURE WITH ANGLED HEAT SINK FINS

(71) Applicant: Rockwell Collins, Inc., Cedar Rapids, IA (US)

(72) Inventor: Richard J. Musiol, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 15/619,036

(22) Filed: Jun. 9, 2017

(51) Int. Cl.
| H05K 7/20 | (2006.01) |
| H05K 7/14 | (2006.01) |
| G06F 13/00 | (2006.01) |
| H02K 5/18 | (2006.01) |

(52) U.S. Cl.
CPC ......... *H05K 7/20409* (2013.01); *G06F 13/00* (2013.01); *H02K 5/18* (2013.01); *H05K 7/14* (2013.01); *H05K 7/20* (2013.01); *H05K 7/20572* (2013.01)

(58) Field of Classification Search
None
See application file for complete search history.

(56) References Cited

U.S. PATENT DOCUMENTS

| 6,975,511 B1* | 12/2005 | Lebo | H05K 7/1412 165/185 |
| 8,064,200 B1* | 11/2011 | West | H05K 7/20563 361/694 |
| 2004/0245866 A1* | 12/2004 | Lopatinsky | F04D 17/04 310/64 |
| 2005/0122686 A1* | 6/2005 | Oyamada | G11B 33/1413 361/699 |
| 2008/0123297 A1* | 5/2008 | Tilton | H05K 7/20345 361/700 |
| 2013/0223012 A1* | 8/2013 | Pierides | B23P 15/26 361/704 |

OTHER PUBLICATIONS

Frigus Primore, Natural Convection and Inclined Parallel Plates, Printed online at: http://akemalhammar.fr/articels2/parallel_pl_Inc.html, Apr. 28, 2017, 5 pages.

* cited by examiner

*Primary Examiner* — Dimary Lopez Cruz
*Assistant Examiner* — Zhengfu Feng
(74) *Attorney, Agent, or Firm* — Angel N. Gerdzhikov; Donna P. Suchy; Daniel M. Barbieri

(57) ABSTRACT

An apparatus and a system including the apparatus. The apparatus may include a modular electronics enclosure. The modular electronics enclosure may be configured to house an electronics device. The modular electronics enclosure may include a side portion. The modular electronics enclosure may further include angled external heat sink fins extending from the side portion.

20 Claims, 11 Drawing Sheets

MODULAR ENCLOSURE WITH ANGLED HEAT SINK FINS

BACKGROUND

Currently implemented modular avionics equipment includes modular avionics enclosures and avionics devices housed within the modular avionics enclosures. Currently implemented modular avionics enclosures are generally parallelepiped-shaped and include generally flat exterior surfaces. The flat exterior surfaces typically include perforations or apertures, which are supplied with forced air from an external source to cool avionics devices contained within such currently implemented modular avionics enclosures. Typically, multiple modular avionics enclosures are arranged on a hollow shelf, which has corresponding slots for the modular avionics enclosures. Often, the hollow shelf forms a manifold through which cool air flows from a blower into the modular avionics enclosures through apertures of bottom surfaces of the modular avionics enclosures. The air exits from the currently implemented modular avionics enclosures through apertures of top surfaces of the modular avionics enclosures into open space above the modular avionics enclosures. Often, multiple shelves are combined into a rack fed by one or two large blowers. The apertures of each modular avionics enclosure must be carefully engineered to provide a precise resistance to the supplied airflow to ensure the air is distributed properly.

Currently implemented racks of modular avionics enclosures present various problems to aircraft manufacturers, avionics equipment designers, and airlines. The required airflow for a modular avionics enclosure is typically a function of the power utilization of the avionics devices contained within the modular avionics enclosure. To achieve the required airflow and ensure smooth aircraft operation, the aircraft manufacturer must balance the airflow throughout the system to accommodate different avionics equipment types from different suppliers to ensure smooth aircraft operation. Additionally, the power utilization of an avionics device contained within the modular avionics enclosure can change throughout the avionics device's life cycle.

Currently implemented modular avionics enclosures often include a perforated shell of hundreds of small diameter apertures surrounding extensive internal avionics structures. Such apertures subject the internal avionics devices to environmental effects, such as moisture exposure, chemical exposure, and electromagnetic interference. As a result, currently implemented modular avionics equipment is costly to produce, is time-consuming to assemble, and requires extensive environmental testing.

Additionally, because currently implemented modular avionics enclosures typically house flight-critical avionics devices, aircraft are often required to include a backup blower system configured to supply forced-air to the modular avionics enclosures in the event that a primary blower system fails. Backup blower systems add weight and expense to the aircraft. Further, the currently implemented modular avionics equipment is typically required to operate without cooling forced-air for extended periods of time to accommodate the event of a blower system failure in flight.

SUMMARY

In one aspect, embodiments of the inventive concepts disclosed herein are directed to an apparatus. The apparatus may include a modular electronics enclosure configured to house an electronics device. The modular electronics enclosure may include a side portion and angled external heat sink fins extending from the side portion.

In a further aspect, embodiments of the inventive concepts disclosed herein are directed to a system. The system may include an electronic equipment rack and a modular electronics enclosure configured to house an electronics device. The modular electronics enclosure may be installed in the electronic equipment rack. The modular electronics enclosure may include a side portion and angled external heat sink fins extending from the side portion.

In a further aspect, embodiments of the inventive concepts disclosed herein are directed to a system. The system may include an electronic equipment rack and two modular electronics enclosures adjacently installed in the electronic equipment rack. The two modular electronics enclosures include a first modular electronics enclosure and a second modular electronics enclosure. Each of the two modular electronics enclosures may be configured to house an electronics device. Each of the two modular electronics enclosures may include a side portion and angled external heat sink fins extending from the side portion. At least some of the angled external heat sink fins of the first modular electronics enclosure may align with at least some of the angled external heat sink fins of the second modular electronics enclosure.

BRIEF DESCRIPTION OF THE DRAWINGS

Implementations of the inventive concepts disclosed herein may be better understood when consideration is given to the following detailed description thereof. Such description makes reference to the included drawings, which are not necessarily to scale, and in which some features may be exaggerated and some features may be omitted or may be represented schematically in the interest of clarity. Like reference numerals in the drawings may represent and refer to the same or similar element, feature, or function. In the drawings.

DETAILED DESCRIPTION

Figure 1A:
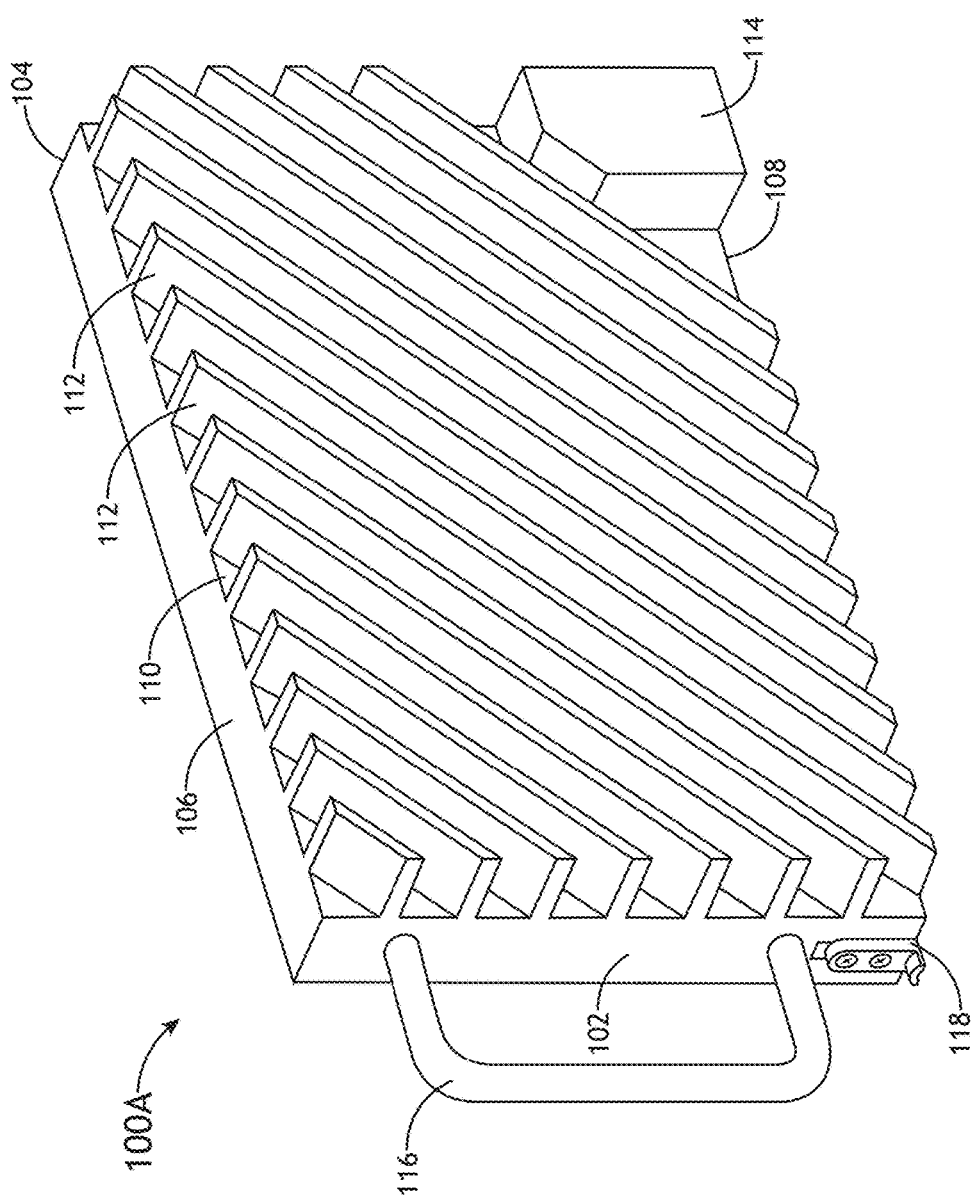
FIG. 1A is a view of an exemplary embodiment of a modular avionics enclosure according to the inventive concepts disclosed herein.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a modular electronics enclosure with angled external heat sink fins and a system including modular electronics enclosures with angled external heat sink fins. For example, the modular electronics enclosure with angled external heat sink fins may be a modular vetronics enclosure with angled external heat sink fins, such as a modular avionics enclosure with angled external heat sink fins. The modular electronics enclosure with angled external heat sink fins may utilize passive cooling rather than forced air cooling.

In some embodiments, a plurality of modular electronics enclosures with angled external heat sink fins may be installed on one or more shelves of an electronic equipment rack. For example, a plurality of modular avionics enclosures with angled external heat sink fins may be installed on one or more shelves of an electronic equipment rack, which may be located in an electronic equipment bay beneath a passenger compartment or beneath a cockpit floor. The electronic equipment bays may be pressurized compartments fed with airflow from an environment control system, which may be the same environmental control system that services passenger compartments. In some embodiments, dynamic airflow moving through an equipment bay can be used to passively cool the avionics devices contained within the plurality of modular avionics enclosures with angled external heat sink fins without the need for supplemental blowers.

In some embodiments, the modular electronics enclosure with angled external heat sink fins may house any number and types of electronic devices (e.g., vetronics devices, such as avionics devices). For example, such electronic devices may include processors (e.g., microprocessors, microcontrollers, field-programmable gate arrays (FPGAs), and/or application-specific integrated circuits (ASICs)), memory, and/or storage devices (e.g., hard disk drives (HDDs) and/or solid-state drives (SSDs)). Such electronics devices produce significant heat, and the angled external heat sink fins of the modular electronics enclosure are configured to dissipate the produced heat.

In some embodiments, heat produced by the internal electronic devices housed within the modular electronics enclosure with angled external heat sink fins may be conducted to one or more sides of the modular electronics enclosure. External heat sink fins may be attached to and/or form part of one or more exterior sides of the modular electronics enclosure. The external heat sink fins may be angled such that vertical positions along the external heat sink fins rise as horizontal positions along the external heat sink fins move from the front toward the back of the modular enclosure. As such, heat produced by the internal electronics is conducted into the one or more sides of the modular electronics enclosure, conducted into the angled external heat sink fins, and then passed to the air. For example, as air in a channel formed between two angled external heat sink fins warms (e.g., due to absorbing heat from the two angled external heat sink fins), the air expands, becoming less dense. Due to the decreased density, the warmed air rises in the channel formed between the two angled external heat sink fins and flows toward the top and back of the modular electronics enclosure. Such a convective process draws cooler air from the electronics bay into openings of channels formed between angled external heat sink fins at the front of the modular electronics enclosure and causes warmed air to exit from openings of channels formed between angled external heat sink fins at the back of the modular electronics enclosure.

Referring now to FIG. 1A, an exemplary embodiment of a modular avionics enclosure 100A according to the inventive concepts disclosed herein is depicted. The modular avionics enclosure 100A may include a front 102, a back 104, a top 106, a bottom 108, a side 110, another side (not shown), angled external heat sink fins 112, a connector assembly 114, a handle 116, and attachment means 118.

In some embodiments, the front 102, the back 104, the top 106, the bottom 108, the side 110, and the other side (not shown) generally form a parallelepiped (e.g., a rectangular cuboid) such that the modular avionics enclosure 100A is generally shaped as a parallelepiped (e.g., a rectangular cuboid) with the angled external heat sink fins 112 extending from the side 110. In some embodiments, the side 110, from which the angled external heat sink fins 112 extend, is a side of such parallelepiped having a greatest surface area.

An interior portion of the modular avionics enclosure 100A may be hollow and configured to internally house any number and types of electronic devices (e.g., avionics devices), such as processors, memory, and/or storage devices. Such electronics devices may be thermally coupled (e.g., via thermal paste, solder connections, a heat spreader, and/or a heat sink base) to the side 110 such that heat produced by such electronics devices may be dissipated through the side 110 and the angled external heat sink fins 112 extending from the side 110. The modular avionics enclosure 100A may be configured to shield such electronics devices from electromagnetic interference and/or moisture. In some embodiments, the modular avionics enclosure 100A may be configured completely enclose such electronics devices; however, in other embodiments, the modular avionics enclosure 100A may include one or more vents.

The angled external heat sink fins 112 and the side 110 may include and/or be implemented as one or more thermally conductive materials, such as copper, a copper alloy, aluminum, an aluminum alloy, iron, steel, diamond, a copper-tungsten pseudoalloy, silicon carbide in aluminum matrix (AlSiC), diamond in copper-silver alloy matrix (Dymalloy), beryllium oxide in beryllium matrix (E-Material), or a combination thereof. Additionally, the front 102, the back 104, the top 106, the bottom 108, and the other side (not shown) may include and/or be implemented as one or more thermally conductive materials.

The angled external heat sink fins 112 may extend (e.g., perpendicularly) from the side 110. In some embodiments, the side 110 and the angled external heat sink fins 112 are formed (e.g., cast, molded, and/or machined) from a single piece of material. In some embodiments, the angled external heat sink fins 112 may be attached (e.g., soldered, welded, screwed, bolted, and/or glued with a thermal paste) to the side 110.

At least a portion of each angled external heat sink fin 112 is non-vertically and non-horizontally disposed relative to the front 102, the back 104, the top 106, and the bottom 108. For example, where the angled external heat sink fins 112 are implemented as straight and parallel angled external heat sink fins (as shown in FIG. 1A), planes extending through the angled external heat sink fins 112 may non-perpendicularly intersect two or more of the front 102, the back 104, the top 106, and the bottom 108. For example, where the angled external heat sink fins 112 are implemented as straight and parallel angled external heat sink fins (as shown in FIG. 1A), an acute angle formed between the bottom 108 and one of the angled external heat sink fins 112 may be between 10 degrees and 80 degrees (e.g., 30 degrees, 45 degrees, or 60 degrees). Similarly, for example, where the angled external heat sink fins 112 are implemented as straight and parallel angled external heat sink fins (as shown in FIG. 1A), an acute angle formed between the front 102 and one of the angled external heat sink fins 112 may be between 10 degrees and 80 degrees (e.g., 30 degrees, 45 degrees, or 60 degrees). Similarly, for example, where the angled external heat sink fins 112 are implemented as straight and parallel angled external heat sink fins (as shown in FIG. 1A), an acute angle formed between the top 106 and one of the angled external heat sink fins 112 may be between 10 degrees and 80 degrees (e.g., 30 degrees, 45 degrees, or 60 degrees). Similarly, for example, where the angled external heat sink fins 112 are implemented as straight and parallel angled external heat sink fins (as shown in FIG. 1A), an acute angle formed between the back 104 and one of the angled external heat sink fins 112 may be between 10 degrees and 80 degrees (e.g., 30 degrees, 45 degrees, or 60 degrees).

Each of the angled external heat sink fins 112 may have any suitable dimensions, such as depth (e.g., depth perpendicular to the side 110), thickness profile, and length. For example, a depth of a particular angled external heat sink fin 112 may vary or remain constant across its length. Additionally, in some embodiments, all of the angled external heat sink fins 112 may have a same thickness profile; in other embodiments, some of the angled external heat sink fins 112 may have different thickness profiles than other of the angled external heat sink fins 112. Each of the angled external heat sink fins 112 may have a uniform or non-uniform thickness profile. For example, thickness of the angled external heat sink fins 112 may taper as the angled external heat sink fins 112 extend from the side 110. Additionally, for example, a thickness profile of particular angled external heat sink fin 112 may vary across its length.

For example, a ratio of a depth of a particular portion of a particular angled external heat sink fin 112 to the thickness at the base (e.g., portion of the fin 112 adjacent to the side 110) of the particular portion of the particular fin 112 may be between 1:1 and 100:1 (e.g., between 2:1 and 20:1).

In some embodiments, lengths of each of the angled external heat sink fins 112 may fully extend between two of the front 102, the back 104, the top 106, and the bottom 108; however, in other embodiments (e.g., as shown in FIGS. 2, 3, and 6-13, where the angled external heat sink fins 112 do not extend fully to the bottom 108), lengths of some of the angled external heat sink fins 112 may not fully extend between two of the front 102, the back 104, the top 106, and the bottom 108.

Each of the angled external heat sink fins 112 may have any suitable shape. For example, as shown in FIG. 1A, each of the angled external heat sink fins 112 may be straight angled external heat sink fins 112. In other embodiments (e.g., as shown in FIGS. 9-12) one or more of the angled external heat sink fins 112 may be non-straight (e.g., curved, formed from at least two intersecting straight sections, formed from at least one straight section and at least one curved section).

Adjacent angled external heat sink fins 112 may have any suitable orientation. For example, as shown in FIG. 1A, each of the angled external heat sink fins 112 may be parallel. In some embodiments, however, at least some adjacent angled external heat sink fins 112 may be non-parallel.

While the angled external heat sink fins 112 are exemplarily depicted as having a particular uniform spacing between adjacent angled external heat sink fins 112, in some embodiments, the angled external heat sink fins 112 may have any suitable uniform or non-uniform spacing between adjacent angled external heat sink fins 112.

The connector assembly 114 may be configured to connect electronics devices of the modular avionics enclosure 100A to a data bus of an aircraft by coupling to a corresponding connector assembly (e.g., 214) of an electronic equipment rack. The connector assembly 114 may be positioned at or near a convergence of the bottom 108 and the back 104 of the modular avionics enclosure 100A so as to allow warm air to exit the back 104 of the modular avionics enclosure 100A and above the connector assembly 114.

The attachment means 118 may be configured to secure the modular avionics enclosure 100A in place when the modular avionics enclosure 100A is installed in an electronic equipment rack. For example, the attachment means 118 may include and/or be implemented as at least one fastener, at least one screw, at least one plate, at least one latch, at least one pin, at least one clip, at least one nut, at least one bolt, at least one tie (e.g., fabric tie or zip tie), at least one strap, at least one hook and loop fastener, at least one snap button, at least one rivet, at least one adhesive (e.g., glue), solder, weld, tape, at least one magnet, at least one chain, at least one cable, at least one zipper, or a combination thereof.

While the modular avionics enclosure 100A has been exemplarily depicted and described as shown in FIG. 1A, in some embodiments, the modular avionics enclosure 100A may be modified to include features and/or elements as depicted and described with respect to the modular avionics enclosures 100B, 100C and/or FIGS. 7-13.

While the modular avionics enclosure 100A has been exemplarily depicted and described as a modular avionics enclosure, some embodiments include a modular electronics enclosure (e.g., a modular vetronics enclosure), which may be implemented similarly and function similarly to the modular avionics enclosure 100A.

While FIG. 1A exemplarily includes elements as shown, in some embodiments, one or more of the elements of the modular avionics enclosure 100A may be omitted, or the modular avionics enclosure 100A may include other elements.

Figure 1B:
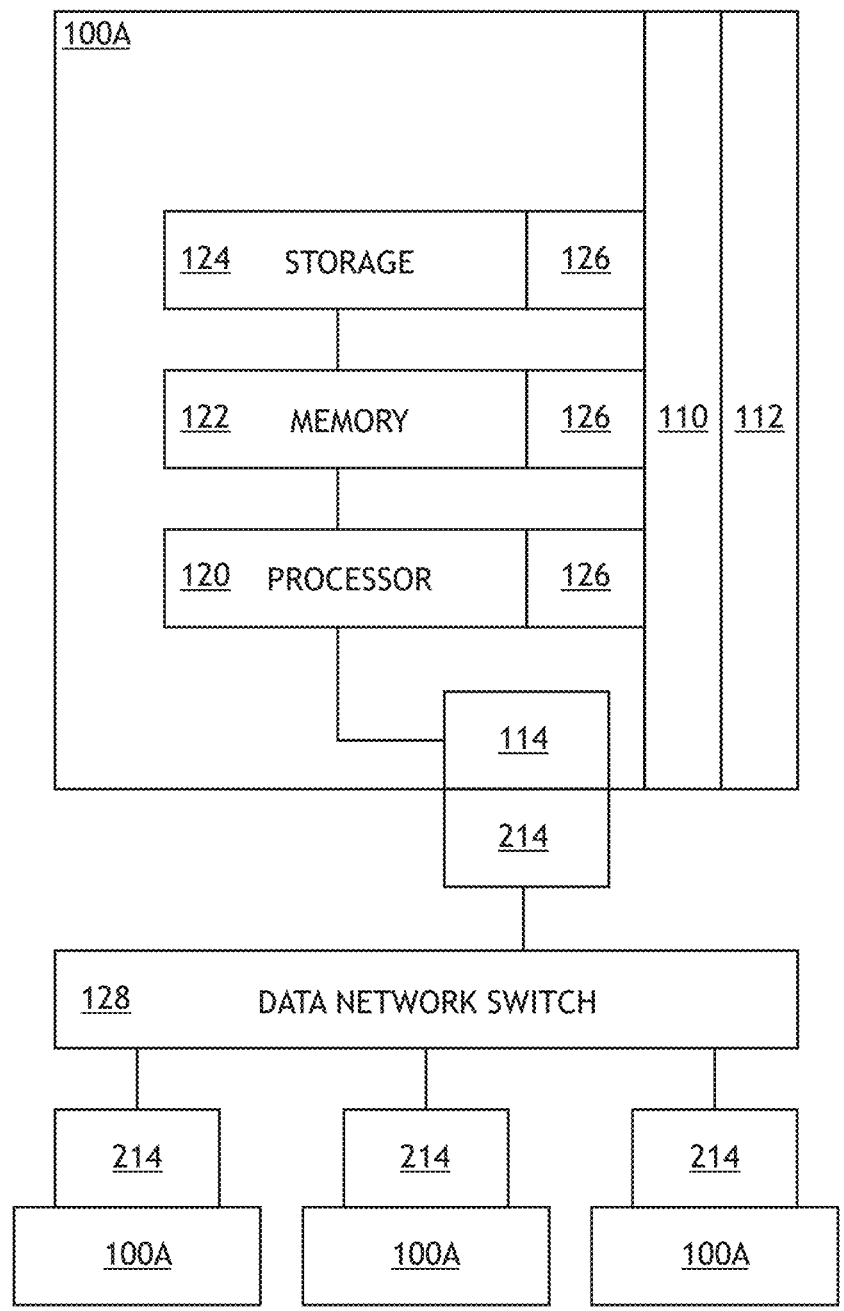
FIG. 1B is a view of an exemplary embodiment including a plurality of modular avionics enclosures communicatively coupled via a data network switch.

Referring now to FIG. 1B, an exemplary embodiment including a plurality of modular avionics enclosures 100A communicatively coupled via a data network switch 128 (e.g., an avionics full-duplex Ethernet (AFDX) switch) according to the inventive concepts disclosed herein is depicted.

As shown in FIG. 1B, an interior portion of one of the modular avionics enclosure 100A may be hollow and configured to internally house any number and types of electronic devices (e.g., avionics devices), such as at least one processor 120, at least one memory 122, and/or at least one storage device 124, some or all of which may be communicatively coupled. Such electronics devices may be communicatively coupled to the data network switch 128 via the connector assembly 114 and the corresponding connector assembly 214. Such electronics devices may be thermally coupled by thermal coupling means 126 (e.g., via thermal paste, solder connections, a heat spreader, and/or a heat sink base) to the side 110 such that heat produced by such electronics devices may be dissipated through the side 110 and the angled external heat sink fins 112 extending from the side 110. The modular avionics enclosure 100A may be configured to shield such electronics devices from electromagnetic interference and/or moisture. In some embodiments, the modular avionics enclosure 100A may be configured to completely enclose such electronics devices; however, in other embodiments, the modular avionics enclosure 100A may include one or more vents.

While the plurality of modular avionics enclosures 100A are exemplarily shown as being communicatively coupled via the data network switch 128, in some embodiments some or all of the plurality of modular avionics enclosures 100A may be communicatively coupled via any suitable data networks and via any suitable data networking components (e.g., at least one bus (e.g., Aeronautical Radio, Incorporated (ARINC) 429 busses), at least one data concentrator, at least one switch, at least one router, or a combination thereof).

While FIG. 1B exemplarily depicts the plurality of modular avionics enclosures 100A communicatively coupled via a data network switch 128, in some embodiments, the plurality of modular avionics enclosures 110A may be implemented as and/or include any suitable number and types of modular avionics enclosures (e.g., 100A, 100B, 100C, or some combination thereof).

Figure 2:
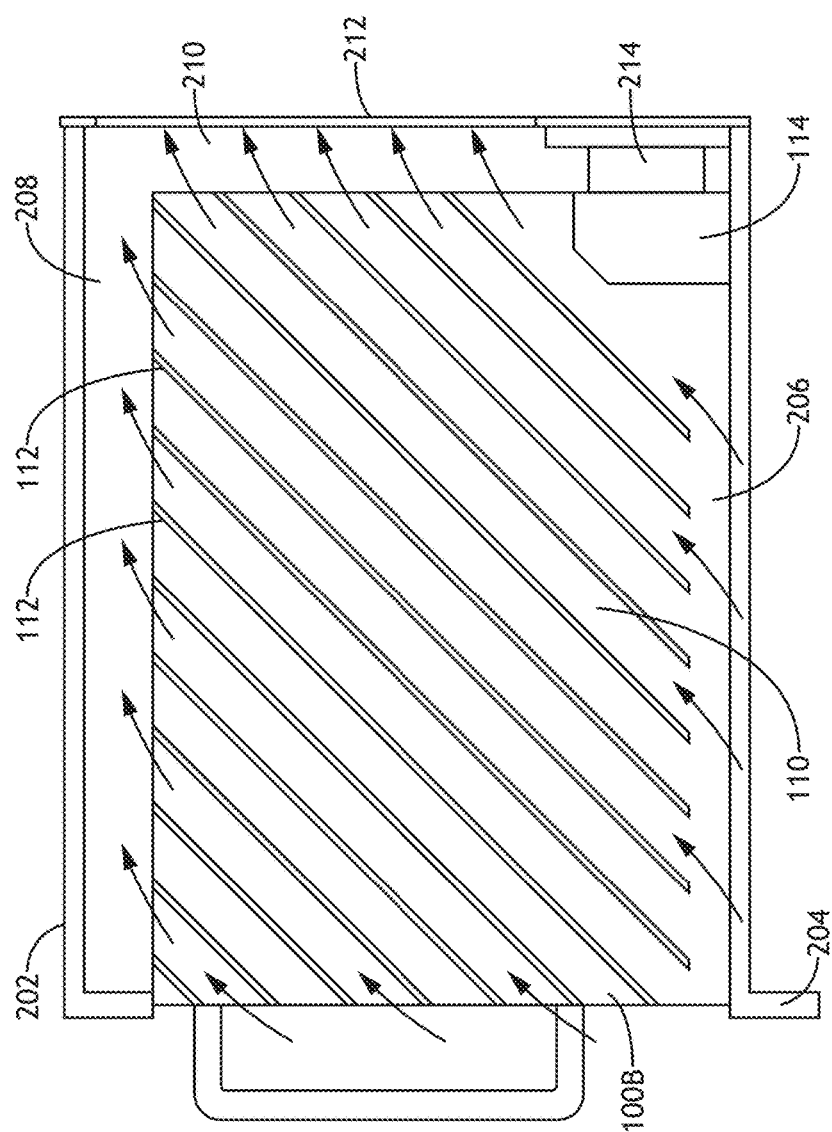
FIG. 2 is a view of an exemplary embodiment of a modular avionics enclosure installed in an electronic equipment rack according to the inventive concepts disclosed herein.

Referring now to FIG. 2, an exemplary embodiment including a modular avionics enclosure 100B installed in an electronic equipment rack according to the inventive concepts disclosed herein is depicted.

The modular avionics enclosure 100B may be implemented similarly to and function similarly as modular avionics enclosure 100A except that the angled external heat sink fins 112 of the modular avionics enclosure 100B terminate above the bottom 108. The termination of the angled external heat sink fins 112 above the bottom 108 forms a bottom fin gap 206, which allows for relatively cooler air to flow toward and reach channels (e.g., all of the channels) formed between adjacent angled external heat sink fins 112.

The modular avionics enclosure 100B may be configured to be installed in an electronic equipment rack. The electronic equipment rack may include one or more shelves (e.g., first shelf 202 and second shelf 204), at least one air opening (e.g., 212), and one or more connector assemblies (e.g., 214). For example, the modular avionics enclosure 100B may be installed between the first shelf 202 and the second shelf 204 such that the modular avionics enclosure 100B is positioned on top of the second shelf and beneath the first shelf. When the modular avionics enclosure 100B is installed, a top air gap 208 may be formed between the top 106 of the modular avionics enclosure 100B and the first shelf 202. When the modular avionics enclosure 100B is installed, a back air gap 210 may be formed between the back 104 of the modular avionics enclosure 100B and an air opening 212 of the electronic equipment rack. The air opening 212 of the electronic equipment rack may be positioned between the first shelf 202 and the second shelf 204 (e.g., between first shelf 202 and the corresponding connector assembly 214). When the modular avionics enclosure 100B is installed, the connector assembly 114 may be coupled with a corresponding connector assembly 214 of the electronic equipment rack.

For example, heat produced by internal electronic devices housed within the modular avionics enclosure 100B may be conducted to one or more sides (e.g., 110) and the angled external heat sink fins 112 of the modular avionics enclosure 1006. As air in channels formed between the angled external heat sink fins 112 warms (e.g., due to absorbing heat from the angled external heat sink fins 112), the air expands, becoming less dense. Due to the decreased density, the warmed air rises in the channels formed between the angled external heat sink fins 112 and flows toward the top 106 and/or the back 104 of the modular avionics enclosure 1006. Such a convective process draws cooler air from the electronics bay into openings of channels formed between the angled external heat sink fins 112 at the front 102 and/or bottom 108 of the modular avionics enclosure 100B and causes warmed air to exit from openings of channels formed between angled external heat sink fins 112 at the top 106 and/or the back 104 of the modular avionics enclosure 1006. The warmed air enters the top air gap 208 and/or the back air gap 210 and exits the electronic equipment rack through the air opening 212 and may flow upward toward a ceiling of the electronic equipment bay.

While the modular avionics enclosure 1006 has been exemplarily depicted and described as shown in FIG. 2, in some embodiments, the modular avionics enclosure 100B may be modified to include features and/or elements as depicted and described with respect to the modular avionics enclosures 100A, 100C and/or FIGS. 7-13.

While the modular avionics enclosure 1006 has been exemplarily depicted and described as a modular avionics enclosure, some embodiments include a modular electronics enclosure (e.g., a modular vetronics enclosure), which may be implemented similarly and function similarly to the modular avionics enclosure 1006.

While FIG. 2 exemplarily includes elements as shown, in some embodiments, one or more of the elements of the electronic equipment rack and/or the modular avionics enclosure 100B may be omitted, or the electronic equipment rack and/or the modular avionics enclosure 100B may include other elements.

Figure 3:
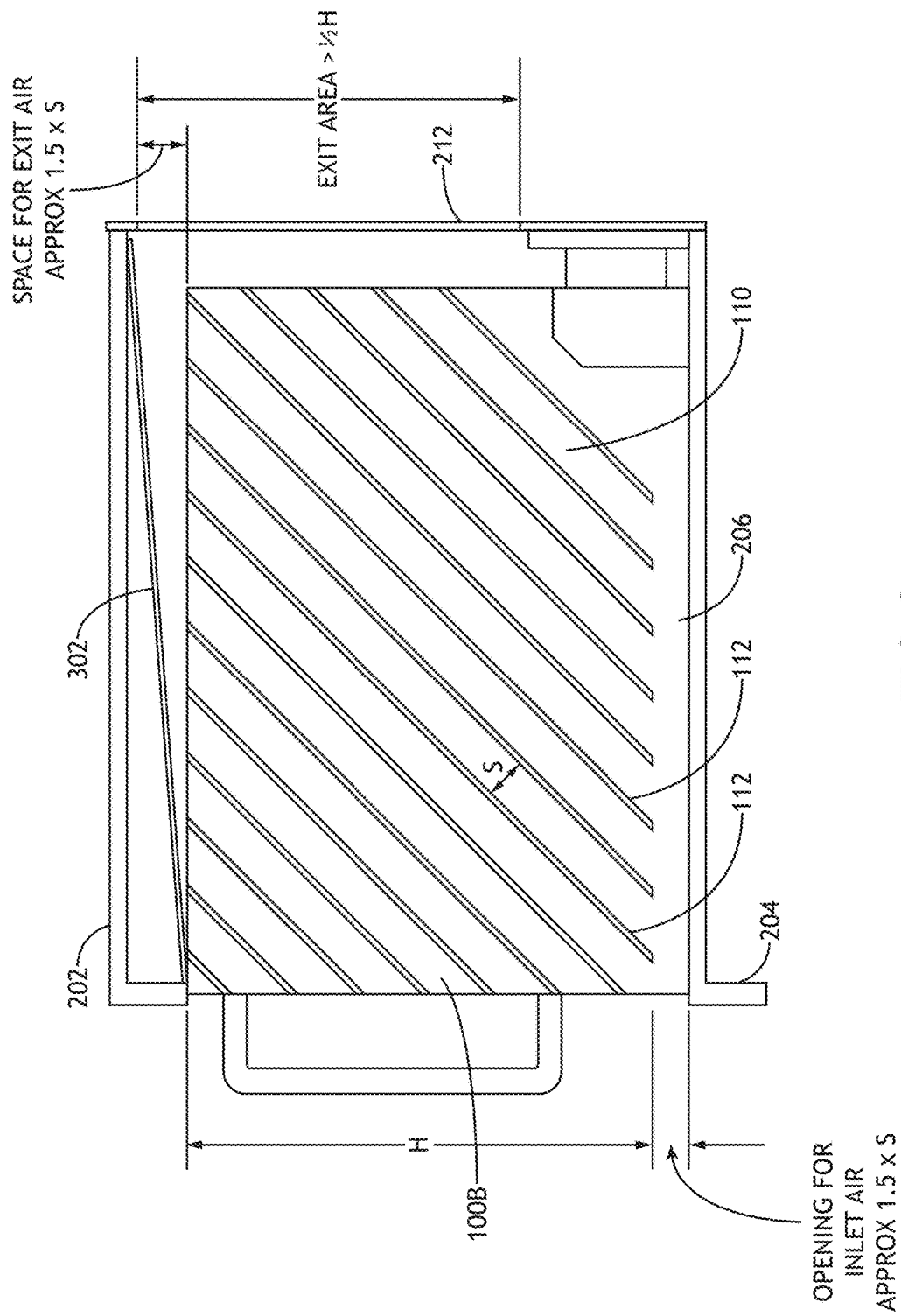
FIG. 3 is a view of an exemplary embodiment of a modular avionics enclosure installed in an electronic equipment rack according to the inventive concepts disclosed herein.

Referring now to FIG. 3, an exemplary embodiment including the modular avionics enclosure 100B installed in an electronic equipment rack according to the inventive concepts disclosed herein is depicted.

The modular avionics enclosure 100B of FIG. 3 may be implemented similarly to and function similarly as modular avionics enclosure 100B of FIG. 2 except that the modular avionics enclosure 100B of FIG. 3 is depicted with exemplary dimensions. For example, the angled external heat sink fins 112 may have a height, H. A space between (i.e., perpendicularly between) two of the angled external heat sink fins 112 may be a distance, S. The bottom fin gap 206 may have a height, approximately 1.5*S (e.g., +/−10%), measured between the bottom 108 and bottom termination height of the angled external heat sink fins 112. While exemplary dimensions of various features of the modular avionics enclosure 100B of FIG. 3 have been described and illustrated, in some embodiments, the modular avionics enclosure 100B may have any suitable dimensions.

The electronic equipment rack of FIG. 3 may be implemented similarly to and function similarly as the electronic equipment rack of FIG. 2 except that the electronic equipment rack of FIG. 3 includes a baffle 302 and is depicted with exemplary dimensions. For example, the top air gap 208 may have a maximum height of approximately 1.5*S (e.g., +/−10%). The air opening 212 may have a height of at least ½*H. The baffle 302 of the electronic equipment rack may be configured to deflect warmed air toward the air opening 212. The baffle 302 may include one or more straight and/or curved portions. While exemplary dimensions of various features of the electronic equipment rack of FIG. 3 have been described and illustrated, in some embodiments, the electronic equipment rack may have any suitable dimensions.

While the modular avionics enclosure 1006 has been exemplarily depicted and described as shown in FIG. 3, in some embodiments, the modular avionics enclosure 100B may be modified to include features and/or elements as depicted and described with respect to the modular avionics enclosures 100A, 100C and/or FIGS. 7-13.

While the modular avionics enclosure 1006 has been exemplarily depicted and described as a modular avionics enclosure, some embodiments include a modular electronics enclosure (e.g., a modular vetronics enclosure), which may be implemented similarly and function similarly to the modular avionics enclosure 100B.

While FIG. 3 exemplarily includes elements as shown, in some embodiments, one or more of the elements of the electronic equipment rack and/or the modular avionics enclosure 100B may be omitted, or the electronic equipment rack and/or the modular avionics enclosure 100B may include other elements.

Figure 4:
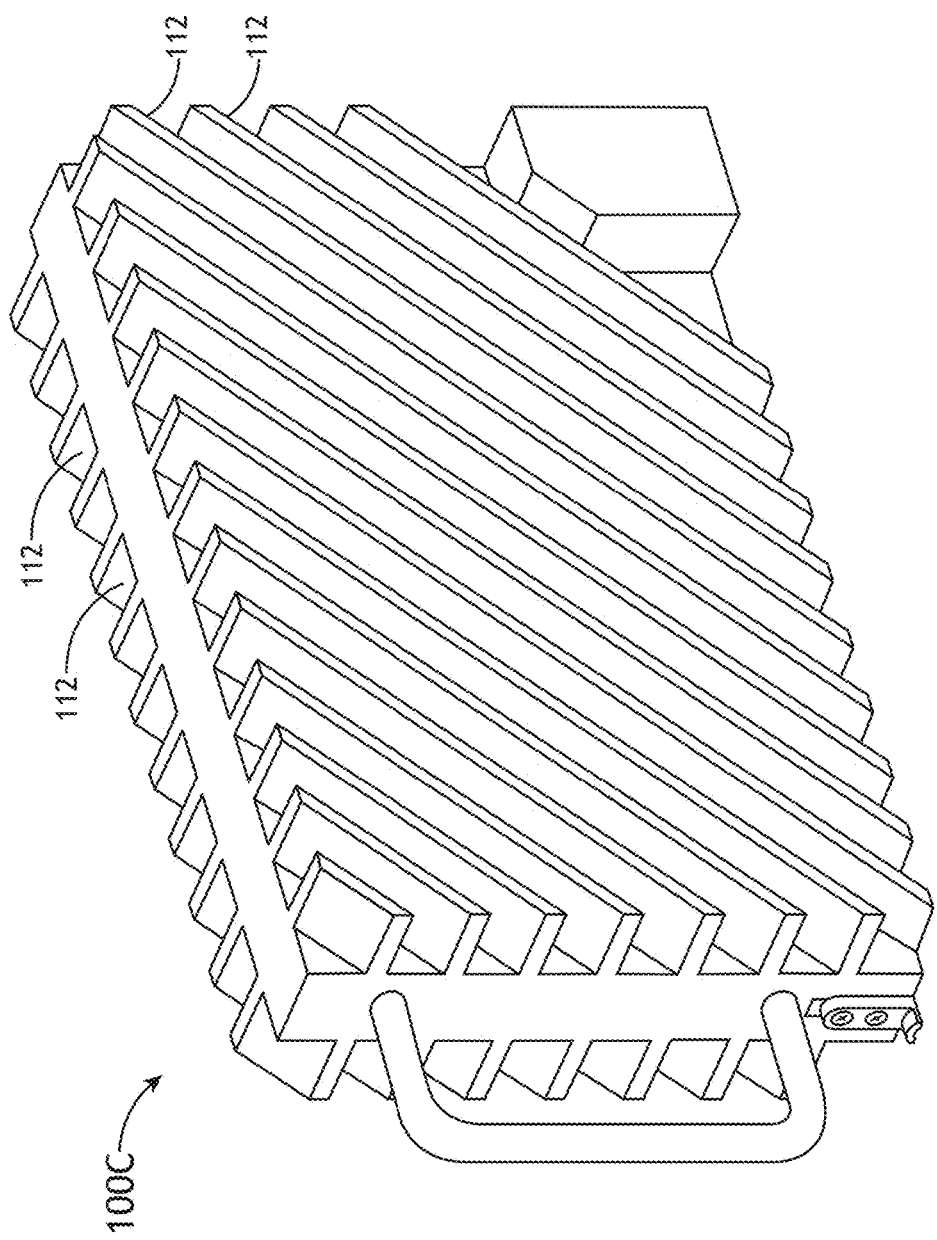
FIG. 4 is a view of an exemplary embodiment of a modular avionics enclosure according to the inventive concepts disclosed herein.

Referring now to FIG. 4, an exemplary embodiment of a modular avionics enclosure 100C according to the inventive concepts disclosed herein is depicted. The modular avionics enclosure 100C may be implemented similarly to and function similarly as modular avionics enclosure 100A except that the modular avionics enclosure 100C may include the angled external heat sink fins 112 on two opposite sides of the modular avionics enclosure 100C. In some embodiments, a pattern of the angled external heat sink fins 112 of a first side may be a mirror image of a pattern of the angled external heat sink fins 112 of a second side such that, if two modular avionics enclosure 100C are installed next to each other, adjacent angled external heat sink fins 112 of the two modular avionics enclosures 100C align.

While the modular avionics enclosure 100C has been exemplarily depicted and described as shown in FIG. 4, in some embodiments, the modular avionics enclosure 100C may be modified to include features and/or elements as depicted and described with respect to the modular avionics enclosures 100A, 100B and/or FIGS. 7-13. For example, the angled external heat sink fins 112 of the modular avionics enclosure 100C may terminate above the bottom 108 similar to the modular avionics enclosure 100B.

While the modular avionics enclosure 100C has been exemplarily depicted and described as a modular avionics enclosure, some embodiments include a modular electronics enclosure (e.g., a modular vetronics enclosure), which may be implemented similarly and function similarly to the modular avionics enclosure 100C.

While FIG. 4 exemplarily includes elements as shown, in some embodiments, one or more of the elements of the modular avionics enclosure 100C may be omitted, or the modular avionics enclosure 100C may include other elements.

Figure 5:
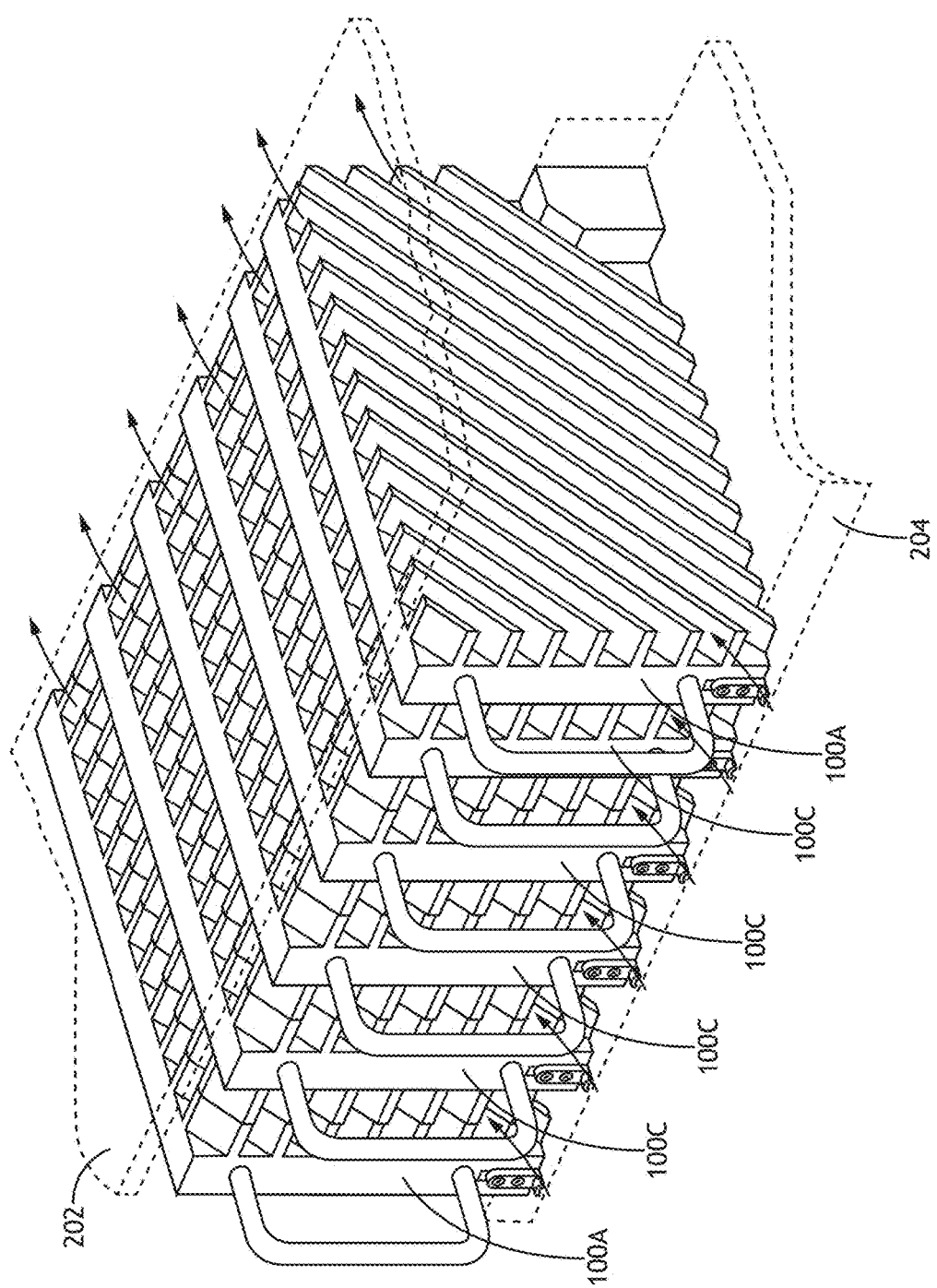
FIG. 5 is a view of an exemplary embodiment of a plurality of modular avionics enclosure installed in an electronic equipment rack according to the inventive concepts disclosed herein.

Referring now to FIG. 5, an exemplary embodiment including a plurality of modular avionics enclosures 100A, 100C installed in an electronic equipment rack according to the inventive concepts disclosed herein is depicted.

The modular avionics enclosures 100A, 100C may be installed adjacently (e.g., abutting and side-by-side) between the first shelf 202 and the second shelf 204 of the electronic equipment rack. The angled external heat sink fins 112 of adjacently installed modular avionics enclosure 100A and/or 100C may align. In some embodiments, the electronic equipment rack includes multiple shelves with more than one row of modular avionics enclosures (e.g., 100A, 100B, and/or 100C).

While the plurality of modular avionics enclosures 100A, 100C installed in the electronic equipment rack has been exemplarily depicted and described as shown in FIG. 5, in some embodiments, the plurality of modular avionics enclosures 100A, 100C installed in the electronic equipment rack may be modified to include features and/or elements as depicted and described with respect to the modular avionics enclosures 1006 and/or FIGS. 2-3 and/or 6-13.

While the plurality of modular avionics enclosures 100A, 100C installed in the electronic equipment rack has been exemplarily depicted and described as having an exemplary combination and arrangement of the modular avionics enclosures 100A, 100C, some embodiments may include any suitable combination and/or arrangement of modular avionics enclosures (e.g., 100A, 100B, 100C, or some combination thereof).

While the plurality of modular avionics enclosures 100A, 100C installed in the electronic equipment rack has been exemplarily depicted and described as the plurality of modular avionics enclosures 100A, 100C installed in the electronic equipment rack, some embodiments include a plurality of modular electronics enclosures (e.g., plurality of modular vetronics enclosures) installed in the electronic equipment rack, which may be implemented similarly and function similarly to the plurality of modular avionics enclosures 100A, 100C installed in the electronic equipment rack.

While FIG. 5 exemplarily includes elements as shown, in some embodiments, one or more of the elements of the electronic equipment rack and/or the plurality of modular avionics enclosures 100A, 100C may be omitted, or the electronic equipment rack and/or the plurality of modular avionics enclosures 100A, 100C may include other elements.

Figure 6:
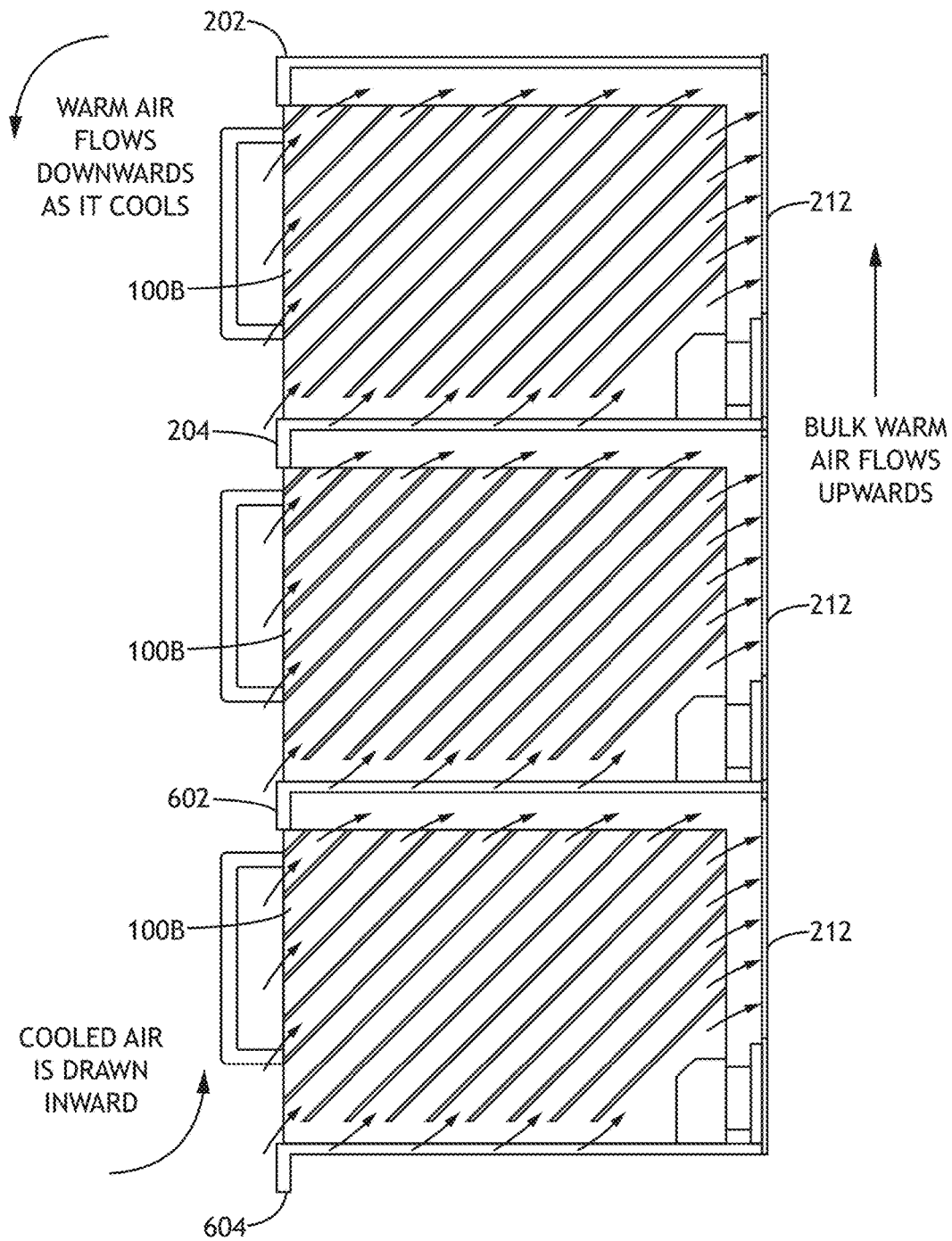
FIG. 6 is a view of an exemplary embodiment of a plurality of modular avionics enclosure installed in an electronic equipment rack according to the inventive concepts disclosed herein.

Referring now to FIG. 6, an exemplary embodiment including a plurality of modular avionics enclosures 100B installed in an electronic equipment rack according to the inventive concepts disclosed herein is depicted.

A first modular avionics enclosure 1006 may be installed between the first shelf 202 and the second shelf 204. In some embodiments, a plurality of modular avionics enclosures 100B may be installed adjacently (e.g., abutting and side-by-side) between the first shelf 202 and the second shelf 204 of the electronic equipment rack. Additionally, in some embodiments, the modular avionics enclosures 100B may include angled external heat sink fins 112 on two opposite sides such that the angled external heat sink fins 112 of adjacently installed modular avionics enclosures 1006 align.

A second modular avionics enclosure 100B may be installed between the second shelf 204 and a third shelf 602. In some embodiments, a plurality of modular avionics enclosures 100B may be installed adjacently (e.g., abutting and side-by-side) between the second shelf 204 and a third shelf 602 of the electronic equipment rack. Additionally, in some embodiments, the modular avionics enclosures 100B may include angled external heat sink fins 112 on two opposite sides such that the angled external heat sink fins 112 of adjacently installed modular avionics enclosures 1006 align.

A third modular avionics enclosure 100B may be installed between the third shelf 602 and the fourth shelf 604. In some embodiments, a plurality of modular avionics enclosures 100B may be installed adjacently (e.g., abutting and side-by-side) between the third shelf 602 and the fourth shelf 604 of the electronic equipment rack. Additionally, in some embodiments, the modular avionics enclosures 100B may include angled external heat sink fins 112 on two opposite sides such that the angled external heat sink fins 112 of adjacently installed modular avionics enclosures 1006 align.

While the plurality of modular avionics enclosures 100B installed in the electronic equipment rack has been exemplarily depicted and described as shown in FIG. 6, in some embodiments, the plurality of modular avionics enclosures 100B installed in the electronic equipment rack may be modified to include features and/or elements as depicted and described with respect to the modular avionics enclosures 100A, 100C and/or FIGS. 2-3 and/or 6-13.

While the plurality of modular avionics enclosures 100B installed in the electronic equipment rack has been exemplarily depicted and described as having an exemplary combination and arrangement of the modular avionics enclosures 1006, some embodiments may include any suitable combination and/or arrangement of modular avionics enclosures (e.g., 100A, 1006, 100C, or some combination thereof).

While the plurality of modular avionics enclosures 100B installed in the electronic equipment rack has been exemplarily depicted and described as the plurality of modular avionics enclosures 100B installed in the electronic equipment rack, some embodiments include a plurality of modular electronics enclosures (e.g., plurality of modular vetronics enclosures) installed in the electronic equipment rack, which may be implemented similarly and function similarly to the plurality of modular avionics enclosures 1006 installed in the electronic equipment rack.

While FIG. 6 exemplarily includes elements as shown, in some embodiments, one or more of the elements of the electronic equipment rack and/or the plurality of modular avionics enclosures 100B may be omitted, or the electronic equipment rack and/or the plurality of modular avionics enclosures 100B may include other elements.

Figure 7:
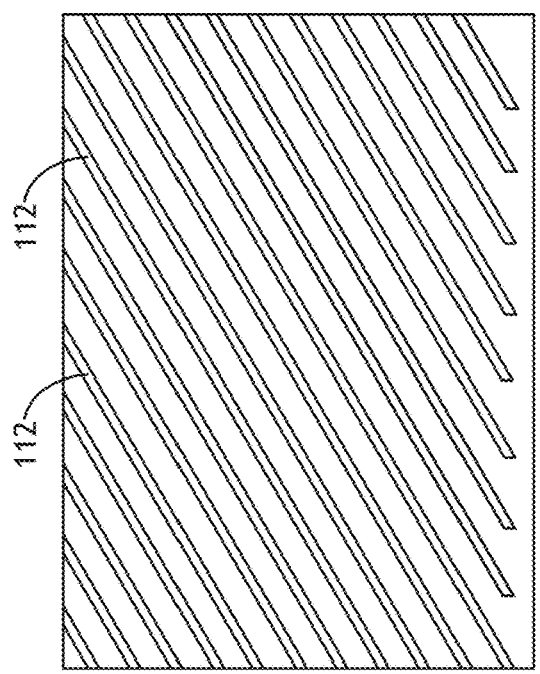
FIG. 7 is a view of an exemplary pattern of angled external heat sink fins of a modular avionics enclosure according to the inventive concepts disclosed herein.

Referring now to FIG. 7, an exemplary pattern of angled external heat sink fins 112 of a modular avionics enclosure (e.g., 100A, 1006, and/or 100C) according to the inventive concepts disclosed herein is depicted. As shown in FIG. 7, the angled external heat sink fins 112 may be implemented as straight and parallel angled external heat sink fins 112. In some embodiments, the angled external heat sink fins 112 may terminate above the bottom 108 so as to form a bottom fin gap 206. An acute angle formed between the bottom 108 and one of the angled external heat sink fins 112 may be any suitable angle, such as angle between 10 degrees and 80 degrees (e.g., 30 degrees, 45 degrees, or 60 degrees).

Figure 8:
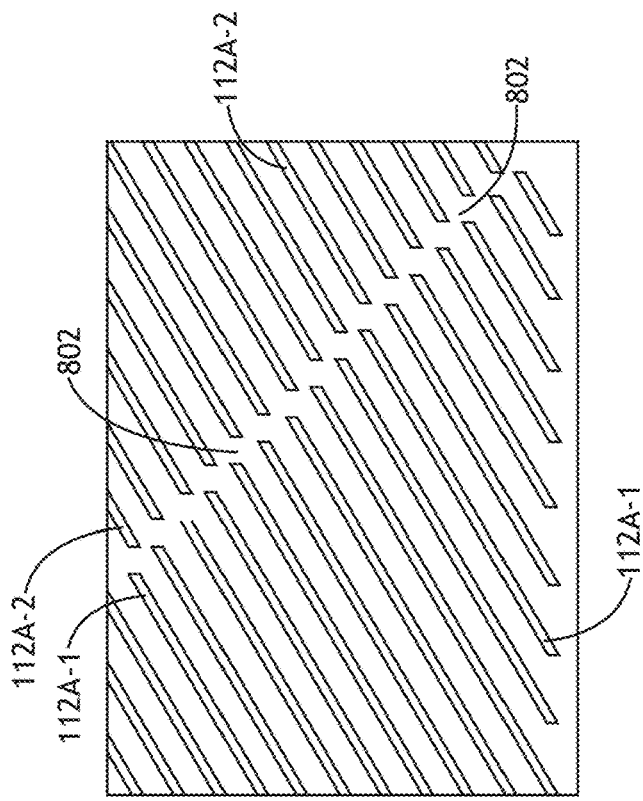
FIG. 8 is a view of an exemplary pattern of angled external heat sink fins of a modular avionics enclosure according to the inventive concepts disclosed herein.

Referring now to FIG. 8, an exemplary pattern of angled external heat sink fins 112A-1, 112A-2 of a modular avionics enclosure (e.g., 100A, 1006, and/or 100C) according to the inventive concepts disclosed herein is depicted. As shown in FIG. 8, the angled external heat sink fins 112A-1, 112A-2 may be staggered with a gap 802 between the angled external heat sink fins 112A-1 and the angled external heat sink fins 112A-2. For example, the angled external heat sink fins 112A-1 may be offset from and be non-collinear to the angled external heat sink fins 112A-2. The angled external heat sink fins 112A-1 may be implemented as straight and parallel fins or include one or more curves. The angled external heat sink fins 112A-2 may be implemented as straight and parallel fins or include one or more curves. In some embodiments, the angled external heat sink fins 112A-1 may terminate above the bottom 108 so as to form a bottom fin gap 206. An acute angle formed between the bottom 108 and one of the angled external heat sink fins 112A-1 may be any suitable angle, such as angle between 10 degrees and 80 degrees (e.g., 30 degrees, 45 degrees, or 60 degrees). An acute angle formed between the bottom 108 and one of the angled external heat sink fins 112A-2 may be any suitable angle, such as angle between 10 degrees and 80 degrees (e.g., 30 degrees, 45 degrees, or 60 degrees).

Figure 9:
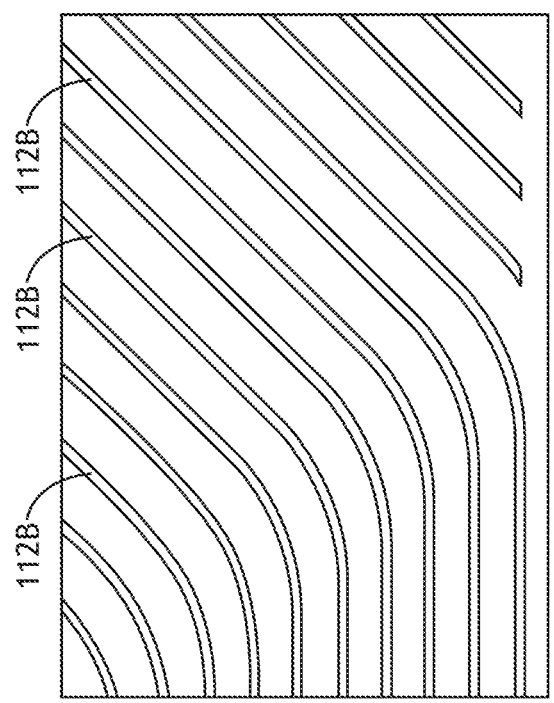
FIG. 9 is a view of an exemplary pattern of angled external heat sink fins of a modular avionics enclosure according to the inventive concepts disclosed herein.

Referring now to FIG. 9, an exemplary pattern of angled external heat sink fins 112B of a modular avionics enclosure (e.g., 100A, 1006, and/or 100C) according to the inventive concepts disclosed herein is depicted. As shown in FIG. 9, the angled external heat sink fins 112B may be implemented as curved angled external heat sink fins 112B. In some embodiments, the curved angled external heat sink fins 112B may be staggered with a gap as similarly depicted in FIG. 8. In some embodiments, inlets and/or outlets of the curved angled external heat sink fins 112B may be grouped as similarly depicted in FIGS. 11-12. In some embodiments, the curved angled external heat sink fins 112B may terminate above the bottom 108 so as to form a bottom fin gap 206.

Figure 10:
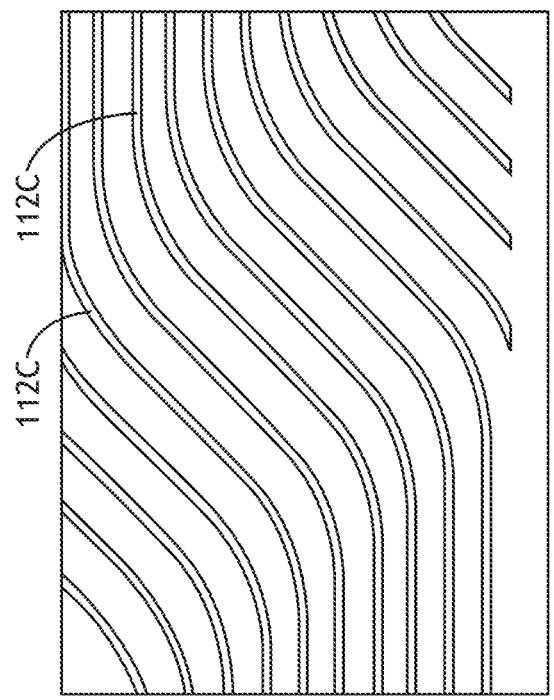
FIG. 10 is a view of an exemplary pattern of angled external heat sink fins of a modular avionics enclosure according to the inventive concepts disclosed herein.

Referring now to FIG. 10, an exemplary pattern of angled external heat sink fins 112C of a modular avionics enclosure (e.g., 100A, 1006, and/or 100C) according to the inventive concepts disclosed herein is depicted. As shown in FIG. 10, the angled external heat sink fins 112C may be implemented as compound curved angled external heat sink fins 112C. In some embodiments, the compound curved angled external heat sink fins 112C may be staggered with a gap as similarly depicted in FIG. 8. In some embodiments, inlets and/or outlets of the compound curved angled external heat sink fins 112B may be grouped as similarly depicted in FIGS. 11-12. In some embodiments, the compound curved angled external heat sink fins 112B may terminate above the bottom 108 so as to form a bottom fin gap 206.

Figure 11:
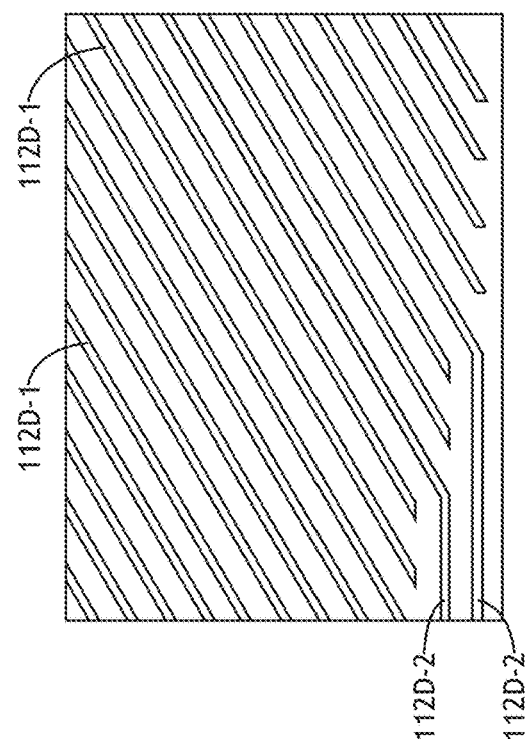
FIG. 11 is a view of an exemplary pattern of angled external heat sink fins of a modular avionics enclosure according to the inventive concepts disclosed herein.

Referring now to FIG. 11, an exemplary pattern of angled external heat sink fins 112D-1, 112D-2 of a modular avionics enclosure (e.g., 100A, 1006, and/or 100C) according to the inventive concepts disclosed herein is depicted. As shown in FIG. 11, the angled external heat sink fins 112D-1, 112D-2 may be implemented as grouped inlet angled external heat sink fins 112D-1, 112D-2 such that channels formed between some of the angled external heat sink fins 112D-1, 112D-2 share a common inlet. In some embodiments, the grouped inlet angled external heat sink fins 112D-1, 112D-2 may be staggered with a gap as similarly depicted in FIG. 8. In some embodiments, at least some of the grouped inlet angled external heat sink fins 112D-1, 112D-2 may be curved, compound curved, and/or straight as similarly depicted in FIGS. 7-10. In some embodiments, the grouped inlet angled external heat sink fins 112D-1, 112D-2 may terminate above the bottom 108 so as to form a bottom fin gap 206.

Figure 12:
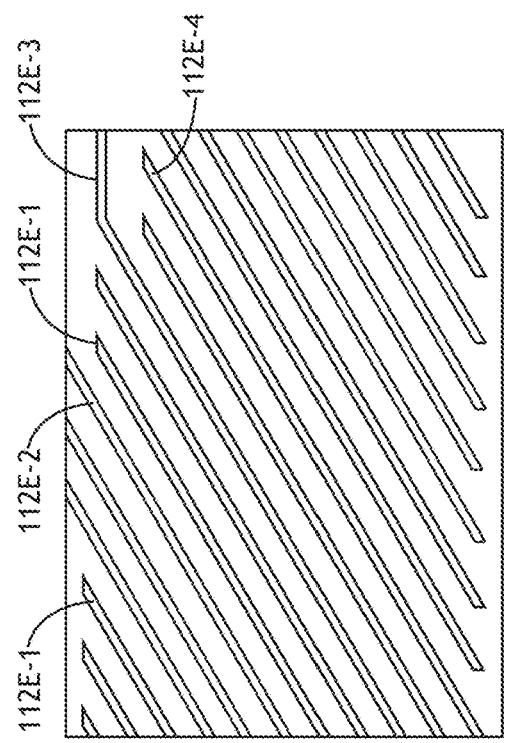
FIG. 12 is a view of an exemplary pattern of angled external heat sink fins of a modular avionics enclosure according to the inventive concepts disclosed herein.

Referring now to FIG. 12, an exemplary pattern of angled external heat sink fins 112E-1, 112E-2, 112E-3, 112E-4 of a modular avionics enclosure (e.g., 100A, 1006, and/or 100C) according to the inventive concepts disclosed herein is depicted. As shown in FIG. 12, the angled external heat sink fins 112E-1, 112E-2, 112E-3, 112E-4 may be implemented as grouped outlet angled external heat sink fins 112E-1, 112E-2, 112E-3, 112E-4 such that channels formed between some of the grouped outlet angled external heat sink fins 112E-1, 112E-2, 112E-3, 112E-4 share a common outlet. In some embodiments, the grouped outlet angled external heat sink fins 112E-1, 112E-2, 112E-3, 112E-4 may be staggered with a gap as similarly depicted in FIG. 8. In some embodiments, at least some of the grouped outlet angled external heat sink fins 112E-1, 112E-2, 112E-3, 112E-4 may be curved, compound curved, and/or straight as similarly depicted in FIGS. 7-10. In some embodiments, the grouped outlet angled external heat sink fins 112E-1, 112E-2, 112E-3, 112E-4 may terminate above the bottom 108 so as to form a bottom fin gap 206.

Figure 13:
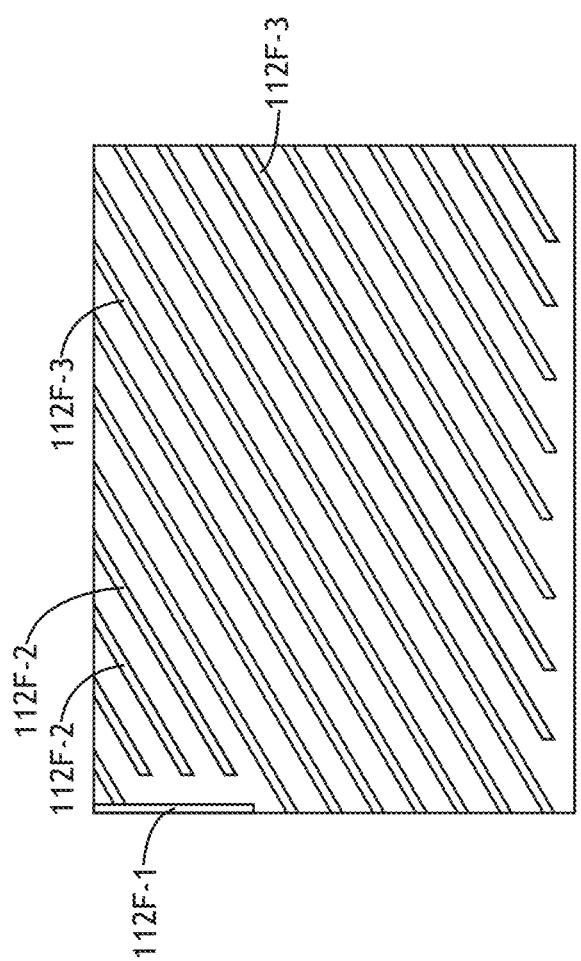
FIG. 13 is a view of an exemplary pattern of a vertical external heat sink fin and angled external heat sink fins of a modular avionics enclosure according to the inventive concepts disclosed herein.

Referring now to FIG. 13, an exemplary pattern of a vertical external heat sink fin 112F-1 and angled external heat sink fins 112F-2, 112F-3 of a modular avionics enclosure (e.g., 100A, 1006, and/or 100C) according to the inventive concepts disclosed herein is depicted. As shown in FIG. 12, the exemplary pattern of the external heat sink fins 112F-1, 112F-2, 112F-3 includes a front vertical external heat sink fin 112F-1. In some embodiments, inlets and/or outlets of the compound curved angled external heat sink fins 112B may be grouped as similarly depicted in FIGS. 11-12. In some embodiments, the external heat sink fins 112F-1, 112F-2, 112F-3 may be staggered with a gap as similarly depicted in FIG. 8. In some embodiments, at least some of the external heat sink fins 112F-1, 112F-2, 112F-3 may be curved, compound curved, and/or straight as similarly depicted in FIGS. 7-10. In some embodiments, the external heat sink fins 112F-1, 112F-2, 112F-3 may terminate above the bottom 108 so as to form a bottom fin gap 206.

As will be appreciated from the above, embodiments of the inventive concepts disclosed herein may be directed to a modular electronics enclosure with angled external heat sink fins and a system including modular electronics enclosures with angled external heat sink fins.

As used throughout and as would be appreciated by those skilled in the art, "at least one non-transitory computer-readable medium" may refer to as at least one non-transitory computer-readable medium (e.g., memory 122, storage 1124, or a combination thereof; e.g., at least one computer-readable medium implemented as hardware; e.g., at least one non-transitory processor-readable medium, at least one memory (e.g., at least one nonvolatile memory, at least one volatile memory, or a combination thereof; e.g., at least one random-access memory, at least one flash memory, at least one ROM (e.g., at least one EEPROM, at least one on-processor memory (e.g., at least one on-processor cache, at least one on-processor buffer, at least one on-processor flash memory, at least one on-processor EEPROM, or a combination thereof), or a combination thereof), at least one storage device (e.g., at least one hard-disk drive, at least one tape drive, at least one solid-state drive, at least one flash drive, at least one readable and/or writable disk of at least one optical drive configured to read from and/or write to the at least one readable and/or writable disk, or a combination thereof), or a combination thereof.

As used throughout, "at least one" means one or a plurality of; for example, "at least one" may comprise one, two, three, . . . , one hundred, or more. Similarly, as used throughout, "one or more" means one or a plurality of; for example, "one or more" may comprise one, two, three, . . . , one hundred, or more. Further, as used throughout, "zero or more" means zero, one, or a plurality of; for example, "zero or more" may comprise zero, one, two, three, . . . , one hundred, or more.

In the present disclosure, the methods, operations, and/or functionality disclosed may be implemented as sets of instructions or software readable by a device. Further, it is understood that the specific order or hierarchy of steps in the methods, operations, and/or functionality disclosed are examples of exemplary approaches. Based upon design preferences, it is understood that the specific order or hierarchy of steps in the methods, operations, and/or functionality can be rearranged while remaining within the scope of the inventive concepts disclosed herein. The accompanying claims may present elements of the various steps in a sample order, and are not necessarily meant to be limited to the specific order or hierarchy presented.

It is to be understood that embodiments of the methods according to the inventive concepts disclosed herein may include one or more of the steps described herein. Further, such steps may be carried out in any desired order and two or more of the steps may be carried out simultaneously with one another. Two or more of the steps disclosed herein may be combined in a single step, and in some embodiments, one or more of the steps may be carried out as two or more sub-steps. Further, other steps or sub-steps may be carried in addition to, or as substitutes to one or more of the steps disclosed herein.

From the above description, it is clear that the inventive concepts disclosed herein are well adapted to carry out the objects and to attain the advantages mentioned herein as well as those inherent in the inventive concepts disclosed herein. While presently preferred embodiments of the inventive concepts disclosed herein have been described for purposes of this disclosure, it will be understood that numerous changes may be made which will readily suggest themselves to those skilled in the art and which are accomplished within the broad scope and coverage of the inventive concepts disclosed and claimed herein.

What is claimed is:

1. A system, comprising:
an electronic equipment rack; and
a modular electronics enclosure configured to house at least one electronics device, the modular electronics enclosure installed in the electronic equipment rack, the modular electronics enclosure comprising:
a side portion;
angled external heat sink fins extending from the side portion;
a connector assembly;
a top portion; and
a back portion,
wherein the electronic equipment rack comprises a first shelf, a second shelf, an air opening, a corresponding connector assembly configured to couple with the connector assembly, and a baffle positioned between the first shelf and the top portion of the modular electronics enclosure, the baffle configured to deflect air toward the air opening of the electronic equipment rack, the modular electronics enclosure installed between the first shelf and the second shelf,
wherein a top air gap is formed between the first shelf and the top portion of the modular electronics enclosure, wherein a back air clap is formed between the air opening of the electronic equipment rack and the back portion of the modular electronics enclosure.

2. The system of claim 1, wherein the modular electronics enclosure is a modular vetronics enclosure.

3. The system of claim 1, wherein the modular electronics enclosure further comprises a bottom portion, wherein bottom portions of the angled external heat sink fins terminate above the bottom portion of the modular electronics enclosure so as to form a gap for airflow between the bottom portion of the modular electronics enclosure and the bottom portions of the angled external heat sink fins.

4. The system of claim 1, wherein the side portion is a first side portion, wherein the modular electronics enclosure further comprises a second side portion opposite the first side portion and second side angled external heat sink fins extending from the second side portion.

5. The system of claim 1, wherein the modular electronics enclosure further comprises a bottom portion, wherein the connector assembly is positioned near a convergence of the bottom portion and the back portion.

6. The system of claim 1, wherein the modular electronics enclosure further comprises a front portion and a handle attached to the front portion.

7. The system of claim 1, wherein the angled external heat sink fins include two adjacent angled external heat sink fins, the two adjacent angled external heat sink fins being straight and parallel.

8. The system of claim 1, wherein the angled external heat sink fins include first angled external heat sink fins and second angled external heat sink fins, wherein the first angled external heat sink fins are staggered from the second angled external heat sink fins with a gap between the first angled external heat sink fins and the second angled external heat sink fins.

9. The system of claim 1, wherein the angled external heat sink fins include a curved angled external heat sink fin.

10. The system of claim 1, wherein the angled external heat sink fins include a compound curved angled external heat sink fin.

11. The system of claim 1, wherein at least some channels formed between at least some of the angled external heat sink fins share a common inlet.

12. The system of claim 1, wherein at least some channels formed between at least some of the angled external heat sink fins share a common outlet.

13. The system of claim 1, wherein the modular electronics enclosure further comprises a vertical external heat sink fin.

14. The system of claim 1, wherein the modular electronics enclosure is a modular avionics enclosure, wherein the modular avionics enclosure and the electronic equipment rack are implemented on an aircraft.

15. The system of claim 1, wherein the at least two modular electronics enclosures are at least two modular avionics enclosures, wherein the modular avionics enclosure and the electronic equipment rack are implemented on an aircraft.

16. The system of claim 1, wherein each of the at least two modular electronics enclosures further comprises a bottom portion, wherein bottom portions of the angled external heat sink fins terminate above the bottom portions of the at least two modular electronics enclosures so as to form a gap for airflow between the bottom portion of the at least two modular electronics enclosures and the bottom portions of the angled external heat sink fins.

17. The system of claim 1, wherein each of the at least two modular electronics enclosures further comprises a bottom portion, and wherein each connector assembly is positioned near a convergence of the bottom portion and the back portion.

18. The system of claim 1, wherein each of the at least two modular electronics enclosures further comprises a front portion and a handle attached to the front portion.

19. A system, comprising:
an electronic equipment rack; and
at least two modular electronics enclosures adjacently installed in the electronic equipment rack, the at least two modular electronics enclosures including a first modular electronics enclosure and a second modular electronics enclosure, each of the at least two modular electronics enclosures configured to house at least one electronics device, each of the at least two modular electronics enclosures comprising:

a side portion;
angled external heat sink fins extending from the side portion;
a connector assembly;
a top portion; and
a back portion,
wherein at least some of the angled external heat sink fins of the first modular electronics enclosure align with at least some of the angled external heat sink fins of the second modular electronics enclosure,
wherein the electronic equipment rack comprises a first shelf, a second shelf, an air opening, a corresponding connector assembly configured to couple with the connector assembly, and a baffle positioned between the first shelf and the top portions of the at least two modular electronics enclosures, the baffle configured to deflect air toward the air opening of the electronic equipment rack, the at least two modular electronics enclosures installed between the first shelf and the second shelf,
wherein a top air gap is formed between the first shelf and the top portions of the at least two modular electronics enclosures, wherein a back air gap is formed between the air opening of the electronic equipment rack and the back portions of the at least two modular electronics enclosures.

20. The system of claim 19, wherein the at least two modular electronics enclosures are at least two modular vetronics enclosures.

\* \* \* \* \*